(12) United States Patent
Wohl, Jr. et al.

(10) Patent No.: US 10,501,840 B2
(45) Date of Patent: Dec. 10, 2019

(54) INFLUENCE ON SURFACE INTERACTIONS BY SUBSTRUCTURE TOPOGRAPHY

(71) Applicant: U.S.A. as represented by the Administrator of the National Aeronautics and Space Administration, Washington, DC (US)

(72) Inventors: Christopher J. Wohl, Jr., Portsmouth, VA (US); Frank L. Palmieri, Hampton, VA (US)

(73) Assignee: United States of America as represented by the Administer of NASA, Washington, DC (US)

( * ) Notice: Subject to any disclaimer, the term of this patent is extended or adjusted under 35 U.S.C. 154(b) by 0 days.

(21) Appl. No.: 15/638,513

(22) Filed: Jun. 30, 2017

(65) Prior Publication Data

US 2018/0002802 A1 Jan. 4, 2018

Related U.S. Application Data

(60) Provisional application No. 62/357,430, filed on Jul. 1, 2016.

(51) Int. Cl.
*C23C 14/02* (2006.01)
*C23C 14/58* (2006.01)
(Continued)

(52) U.S. Cl.
CPC ........ *C23C 14/028* (2013.01); *B23K 26/3584* (2018.08); *C23C 14/58* (2013.01);
(Continued)

(58) Field of Classification Search
CPC ... F01C 5/288; B64C 3/26; B64C 3/20; B64C 3/36; F01D 5/286; F01D 5/12; F01D 5/28
See application file for complete search history.

(56) References Cited

U.S. PATENT DOCUMENTS 4,410,682 A * 10/1983 Rosser ................... C08K 5/06
523/435
6,884,507 B2 * 4/2005 Lin ....................... C08G 18/10
428/402.21

(Continued)

OTHER PUBLICATIONS

Style et al., "Patterning droplets with durotaxis," Publication, May 24, 2013, 6 pages.
(Continued)

*Primary Examiner* — Michael P Wieczorek
(74) *Attorney, Agent, or Firm* — Jennifer L. Riley; Robin W. Edwards

(57) ABSTRACT

A method of forming a smooth aerodynamic surface that permits laminar flow of air over the smooth aerodynamic surface. Selected portions of a surface of a substrate material are ablated utilizing a laser to form a treated substrate surface having a predefined roughness. The treated substrate surface is coated to form a solid layer of material having a smooth aerodynamic surface that promotes laminar flow. The solid layer of material has a lower modulus of elasticity than the substrate material to provide durotaxis when an insect impacts the solid layer of epoxy material to thereby reduce adhesion of insect residue or other matter to the smooth aerodynamic surface.

19 Claims, 5 Drawing Sheets

(51) Int. Cl.
    *F01D 5/28*         (2006.01)
    *B23K 26/352*    (2014.01)
    *B64C 3/26*        (2006.01)
    *B64D 15/00*      (2006.01)
    *B05D 5/08*       (2006.01)
    *B05D 3/12*       (2006.01)

(52) U.S. Cl.
    CPC ............... *F01D 5/288* (2013.01); *B05D 3/12* (2013.01); *B05D 5/08* (2013.01); *B05D 2202/25* (2013.01); *B05D 2504/00* (2013.01); *B64C 3/26* (2013.01); *B64D 15/00* (2013.01)

(56) References Cited

U.S. PATENT DOCUMENTS

| | | | |
|---|---|---|---|
| 8,987,632 B2 * | 3/2015 | Wohl, Jr. | B23K 26/0081 |
| | | | 156/257 |
| 2011/0286854 A1 * | 11/2011 | Watson | F01D 5/288 |
| | | | 416/241 R |
| 2015/0003996 A1 * | 1/2015 | Krishna | C09D 127/12 |
| | | | 416/241 R |
| 2015/0344748 A1 | 12/2015 | Wohl et al. | |

OTHER PUBLICATIONS

Eric Gershon, "Water droplets prefer the soft touch," Publication, Jun. 24, 2013, 2 pages.
Style et al., Patterning droplets with durotaxis, web page Publication, https://www.ncbi.nlm.nih.gov/pmc/articles/PMC3732974/, 8 pages.

* cited by examiner

INFLUENCE ON SURFACE INTERACTIONS BY SUBSTRUCTURE TOPOGRAPHY

CROSS-REFERENCE TO RELATED PATENT APPLICATION

This patent application claims the benefit of and priority to U.S. Provisional Patent Application No. 62/357,430, filed on Jul. 1, 2016, the contents of which is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

The present disclosure relates to a method of reducing buildup of insect residue and other matter on aerodynamic surfaces. More specifically, a subsurface topography is formed utilizing laser ablation micro-machining, and the substrate is then coated with an epoxy-based resin or other suitable material to provide a substantially smooth aerodynamic surface that reduces biological surface contamination while providing a smooth surface to reduce ice buildup and promote laminar flow.

Various aerodynamic shapes (e.g., airfoils) have been developed. These shapes may be configured to promote laminar flow over an aerodynamic surface to reduce aerodynamic drag.

However, in use, insect matter, ice, or other material may become adhered to the aerodynamic surface. This may create surface roughness that disrupts laminar flow over the aerodynamic surface. Various surface treatments have been developed in an effort to reduce or prevent buildup of insect matter, ice, and other substances on aerodynamic surfaces.

As discussed in U.S. Pat. No. 8,987,632, which is incorporated herein by reference in its entirety, interfacial interactions are governed by the surface energy of the contacting materials. The proclivity for favorable (adhesive or wetting) or (unfavorable adhesive or non-wetting) interactions will depend on the relative magnitude of these surface energies. As a result, the ability to controllably alter a material's surface energy is of great significance. Differences in the surface energy of materials can often be observed via water contact angle values.

Although laser ablation of a substrate to modify surface energy may reduce buildup of insect residue or the like on the treated surface, ice buildup on the surface may still occur (at least to some extent) due to the roughness of the treated/ablated surface. Also, because the ablated surface is not smooth, it may interfere with laminar flow over the surface if the surface comprised of the ablated surface is utilized for an airfoil or other aerodynamic surface.

Accordingly, materials having beneficial aspects of both topographically rich (rough) and smooth surfaces are desirable.

BRIEF SUMMARY OF THE INVENTION

The present disclosure utilizes differential interfacial stresses to achieve a desired interfacial response. There is precedence for this regarding the behavior of water droplets disposed on a surface of an extremely soft material (e.g., silicone) that is disposed on a substrate having an uneven surface. Water droplets on the soft flat surface tend to migrate towards regions on the soft surface where recesses are present in the subsurface. This behavior is due to the variation in thickness of the soft planarizing layer, which generates asymmetric interfacial interactions that ultimately drive droplet motion. As the droplet contacts the surface, the surface tension pulls the soft substrate material up around the contact line, while the Laplace pressure deforms the soft substrate material down over the entire contact area making a dimple. When these interactions are not uniform around the droplet, the differences in surface deformation can cause the droplets to move towards regions of greater deformation, i.e., durotaxis.

The present disclosure employs this phenomenon for adhesion prevention in extreme environments such as the leading edge of aircraft, rotorcraft propeller blades, wind turbines, etc. Subsurface topographies are generated using a suitable surface modification technique resulting in random or patterned surface topographies (e.g. laser ablation micro-machining) of substrates such as aluminum or other suitable material. Laser processing provides flexibility and control of the topography generation and is scale-able up to manufacturing levels. Planarity of the modified surfaces may be achieved via epoxy-based resins or other suitable materials. Although epoxies have much greater stiffness than the precedent silicone materials, the impact events in extreme (aerodynamic) environments provides sufficiently more energy translated into "wetting" the substrate than the cases described in the literature.

Another aspect of the present disclosure is a method of forming an aerodynamic surface that enables retention of laminar flow of air over the aerodynamic surface. The method includes ablating at least a selected portion of a surface of a substrate material utilizing a laser to form a treated substrate surface that preferably has a roughness of about 1.0 micrometer to about 300 micrometers. The surface roughness may be from about 1.0 micrometer to about 3.0 micrometers according to other aspects of the present disclosure. The treated substrate surface is coated with a coating material such as an uncured epoxy, and the epoxy material is then cured to form a solid layer of epoxy on the treated substrate surface. The uncured epoxy may have a viscosity of about 5 to about 100000 cp. The solid layer of epoxy has an aerodynamic surface that enable maintenance of laminar flow of air over the smooth aerodynamic surface. The aerodynamic surface formed by the solid layer of epoxy preferably has a roughness of less than about 20 microinches. The solid layer of epoxy may have a thickness of about 1.0 micrometers to about 20.0 micrometers. Alternatively, the solid layer of epoxy may have a thickness of about 1.0 micrometers to about 100 micrometers. The solid layer of epoxy has a lower modulus of elasticity than the substrate material to provide durotaxis when an insect impacts the solid layer of epoxy material to thereby reduce adhesion of insect residue on the smooth aerodynamic surface of the solid layer of epoxy. The solid layer of epoxy or other coating material may have a modulus of, for example, about 4,000 psi to about 435,000 psi.

The smooth aerodynamic surface may comprise, for example, a leading edge portion of a wing of an aircraft, a rotor/propeller blade, wind turbine blade, fuselage of an aircraft, horizontal and vertical stabilizers of an aircraft, surface of a motor vehicle, or other such surface. A portion of such surfaces may be treated, or the entire surface may be treated and coated. The solid layer of epoxy preferably has a modulus of elasticity that is at least about an order of magnitude less than a modulus of elasticity of the substrate material. The substrate material may comprise aluminum, titanium, fiber reinforced composites, or other material. The composite material may comprise reinforcing fibers embedded in a polymer matrix. Although the present disclosure is suitable for aerodynamic surfaces that are configured to provide laminar flow, the surfaces and treatment processes of the present disclosure could be utilized in connection with other types of aerodynamic surfaces, or surfaces that are not aerodynamic.

Another aspect of the present disclosure is a method of forming a smooth aerodynamic surface that permits laminar flow of air over the smooth aerodynamic surface. The method includes providing a material forming a substrate, wherein the material has a first modulus of elasticity. At least a selected portion of a surface of the substrate is ablated utilizing a laser to form a treated substrate surface having a roughness of about 1.0 micrometer to about 300 micrometers, or about 100 micrometers, or about 3.0 micrometers. The treated substrate surface is coated with a suitable material such as an uncured polymer (e.g. epoxy) material, and the epoxy material is cured to form a solid layer of epoxy on the treated substrate surface. The solid layer of epoxy has a second modulus of elasticity that is at least about an order of magnitude less than the first modulus of elasticity to thereby reduce adhesion of insect residue on the solid layer of epoxy due to the lower modulus of elasticity of the solid layer of epoxy. The solid layer of epoxy may have a thickness of about 1.0-100.0 micrometers. It will be understood that the thickness of the coating may vary depending upon the modulus of the coating material. For example, if the coating material comprises an epoxy, the coating may be 50 micrometers or less. However, if a coating material having a lower modulus is utilized, a thicker coating (e.g., 100 micrometers) may be utilized.

Yet another aspect of the present disclosure is a method of forming an aerodynamic surface that permits laminar flow of air over the aerodynamic surface. The method includes ablating at least a selected portion of a surface of a substrate material utilizing a laser to form a treated substrate surface having a predefined roughness. The treated substrate surface is coated with a coating material having a modulus of elasticity that is at least about one order of magnitude less than a modulus of the substrate material. The coating material is cured to form a solid layer of the coating material. The cured coating material has a smooth aerodynamic surface that permits laminar flow of air over the aerodynamic surface. The solid layer of coating material reduces adhesion of insect residue due to the greater elasticity of the coating material relative to the elasticity of the substrate material.

The laser ablation may, optionally, ablate the substrate surface in a manner that causes the treated substrate surface to include a plurality of parallel grooves that are spaced apart about 25 micrometers, wherein the parallel grooves are about 5 micrometers to about 75 micrometers wide, and have a depth of about 0.1 micrometers to about 40 micrometers. The laser may, optionally, ablate the substrate surface in a manner that causes the treated substrate surface to have a plurality of grooves that crisscross.

Yet another aspect of the present disclosure is a method of imparting specific properties (i.e., biological contamination resistance) which require topographical modification while maintaining topographies amenable to laminar flow.

These and other features, advantages, and objects of the present disclosure will be further understood and appreciated by those skilled in the art by reference to the following specification, claims, and appended drawings.

DETAILED DESCRIPTION OF THE INVENTION

Figure 3:
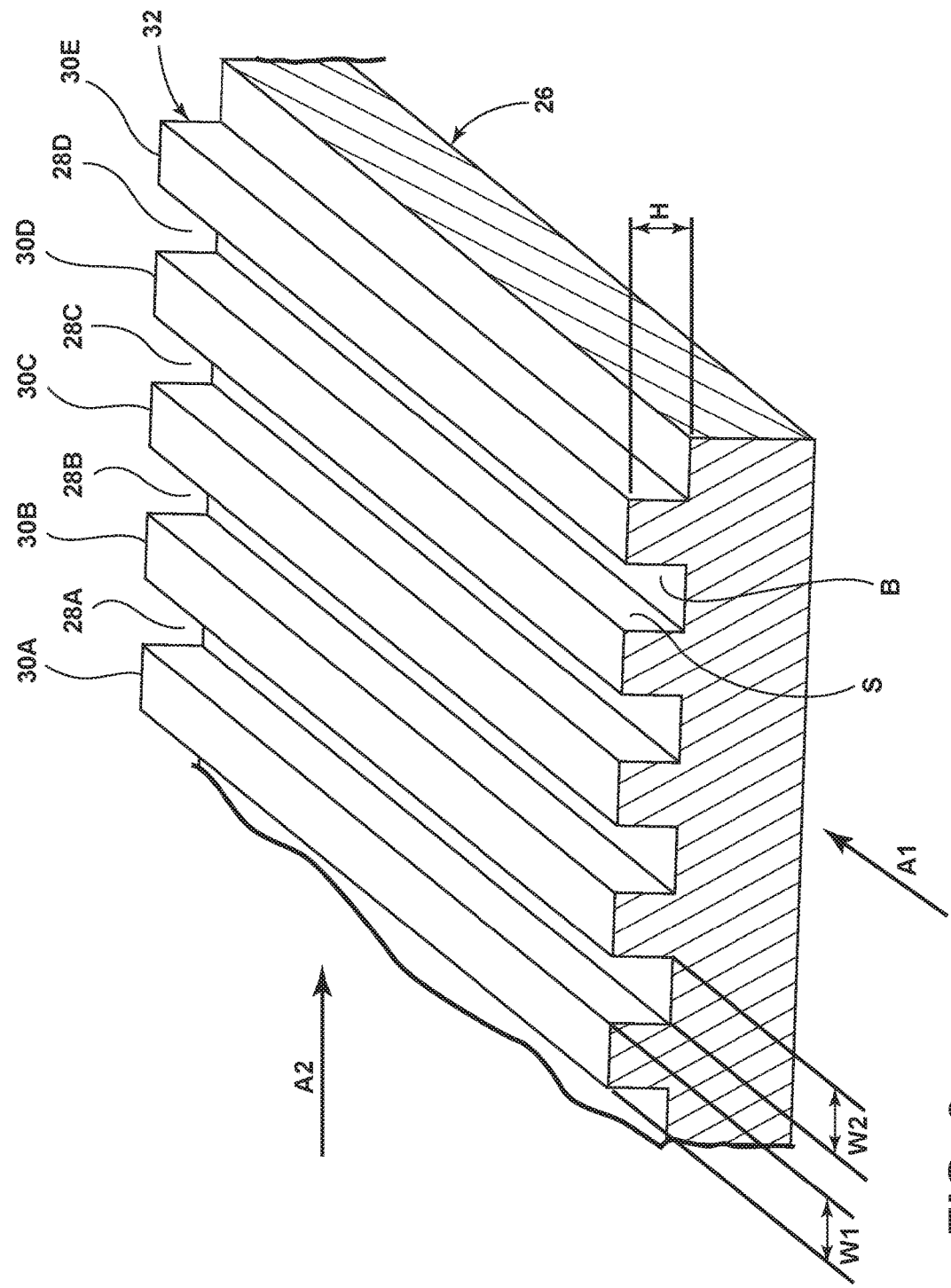
FIG. 3 is a partially fragmentary isometric view of a substrate material that has been at least partially ablated utilizing a laser to form a plurality of generally parallel grooves and ridges.
Figure 4:
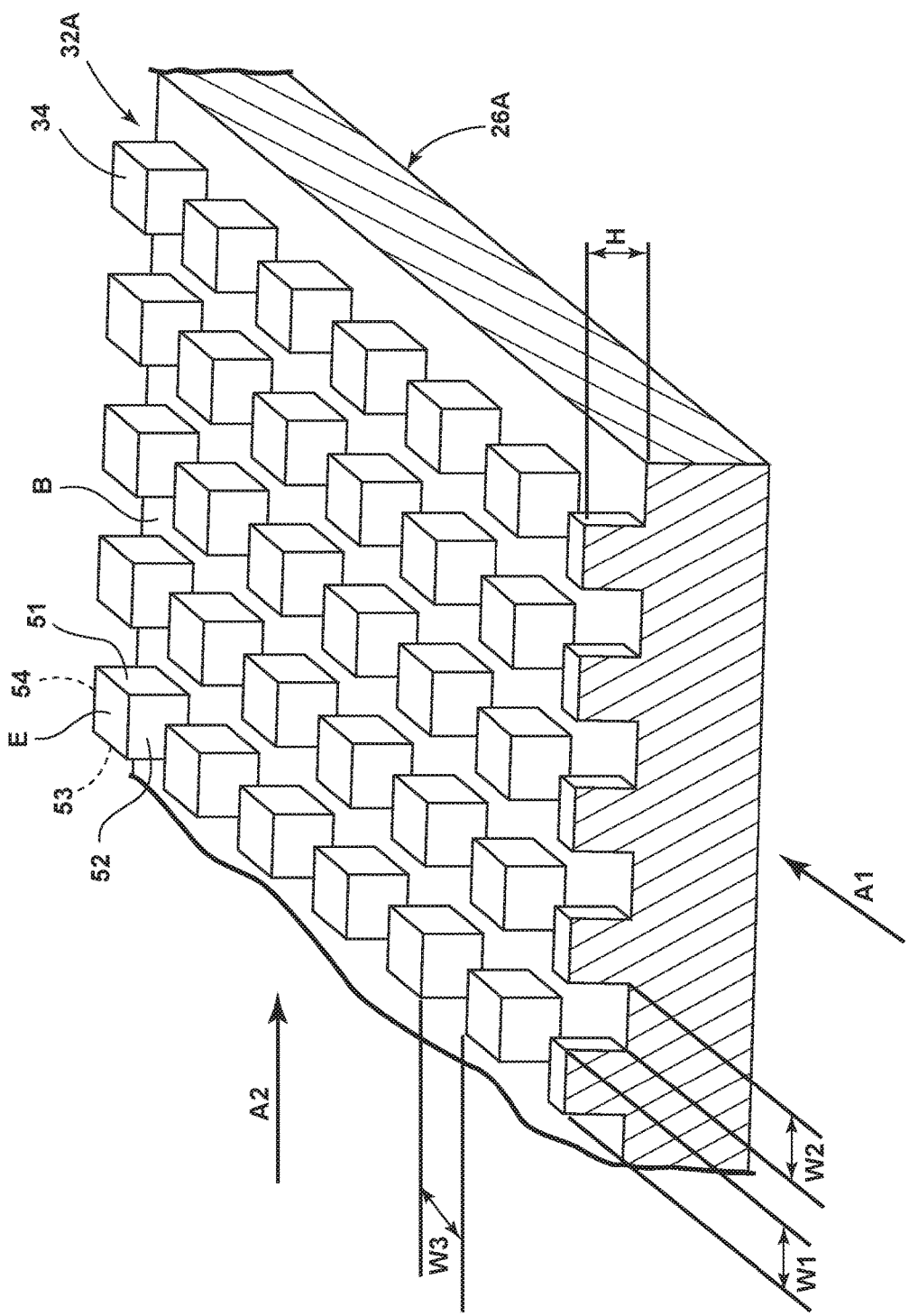
FIG. 4 is a partially fragmentary isometric view of a substrate material that has been at least partially ablated utilizing a laser to form a plurality of protrusions.
Figure 5:
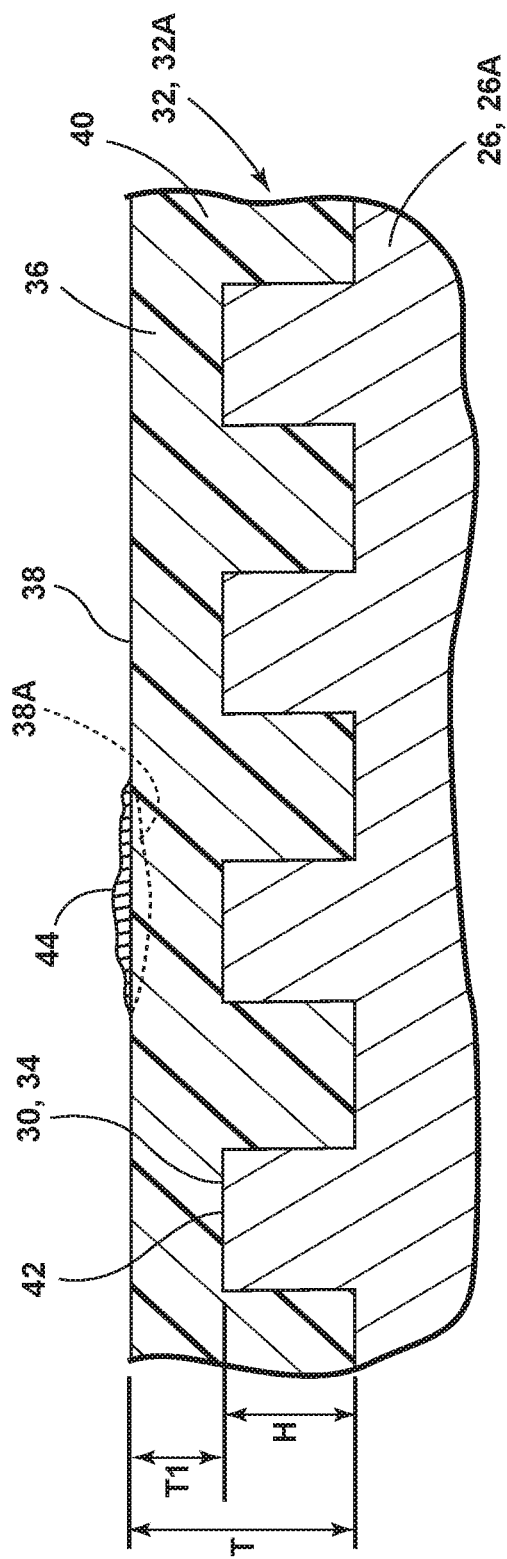
FIG. 5 is an enlarged cross sectional view showing a laser-ablated substrate surface that has been coated with a second material to provide a smooth aerodynamic outer surface.

For purposes of description herein, the terms "upper," "lower," "right," "left," "rear," "front," "vertical," "horizontal," and derivatives thereof shall relate to the invention as oriented in FIGS. 3-5. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
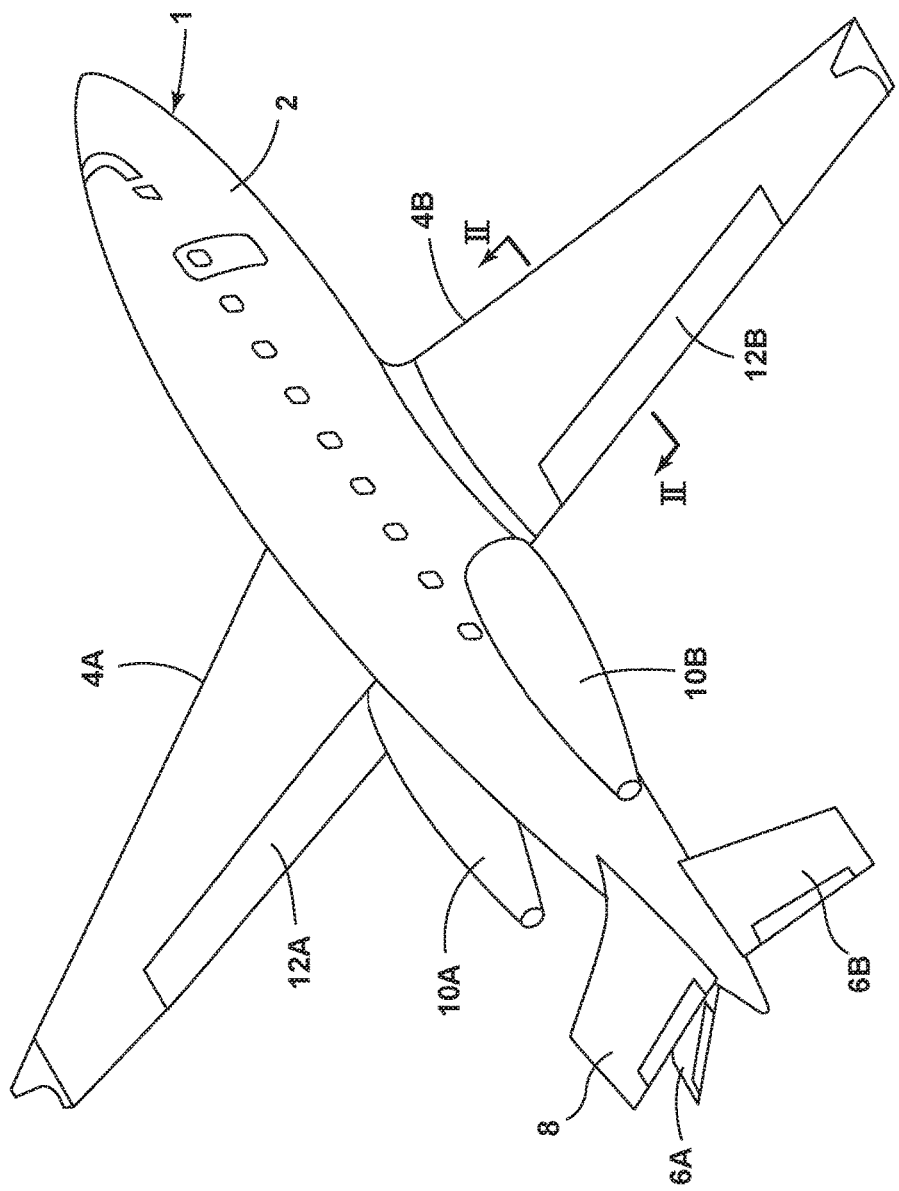
FIG. 1 is a partially schematic isometric view of an aircraft having aerodynamic surfaces.

With reference to FIG. 1, an aircraft 1 includes a fuselage 2, wings 4A and 4B, horizontal stabilizers 6A and 6B, and a vertical stabilizer 8. The aircraft 1 also includes a propulsion system such as turbofan engines 10A and 10B. Wings 4A and 4B may include control surfaces such as flaps 12A and 12B, respectively. The horizontal stabilizers 6A and 6B and the vertical stabilizer 8 may also include control surfaces. In general, the outer surfaces of these aircraft structures comprise aerodynamic surfaces that are configured to minimize aerodynamic drag.

Figure 2:
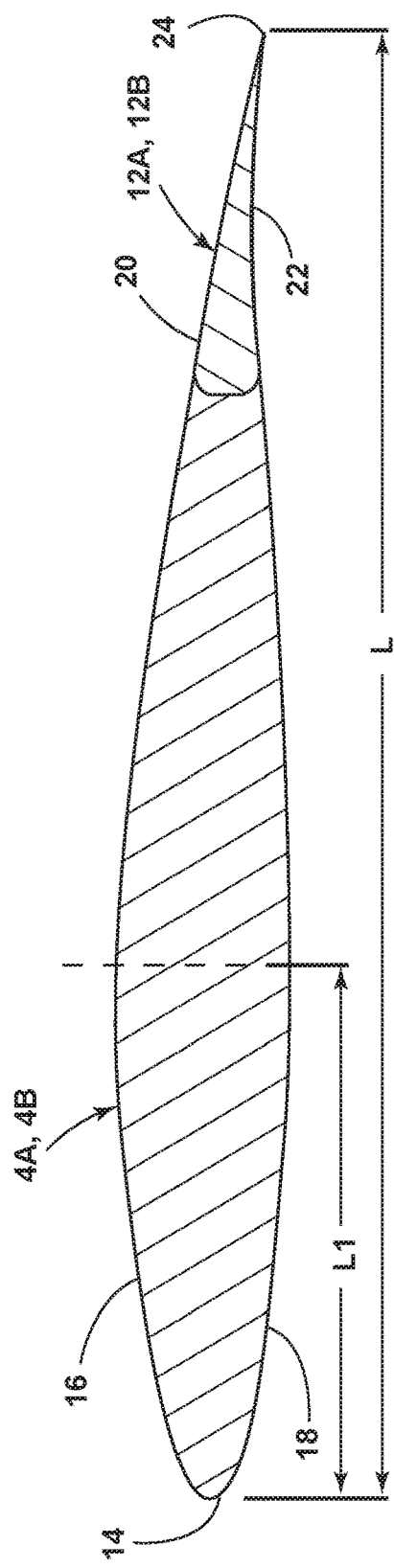
FIG. 2 is a cross sectional view of a portion of a wing of the aircraft of FIG. 1 taken along the line II-II.

With reference to FIG. 2, wings 4A and 4B include a leading edge surface 14, and upper and lower surfaces 16 and 18, respectively. Similarly, the flaps 12A and 12B include upper and lower surfaces 20 and 22. The leading edge portion 14 of wings 4A and 4B may experience significant buildup of insect residue due to impact with insects during flight of aircraft 1. The surfaces closer to trailing edge 24 typically experience reduced buildup of insect residue. Accordingly, the surface treatment and coating process of the present application may be utilized to treat the leading edge 14 and forward portions of upper and lower surfaces 16 and 18, respectively. Alternatively, the entire outer surfaces 16, 18, 20, and 22 may be treated. Typically, if only the more critical portions of the surfaces are treated, either the upper surface 16 or lower surface 18 or both may be treated to a distance "L1" from the leading edge 14. The distance L1 may be a fraction of the cord length "L." For example, the distance L1 may be about 10%, about 20%, or about 30% etc. of the cord length L. It will be understood that the entire surface of an aircraft or other vehicle may be treated, or the treatment may be limited to the leading edges of the aerodynamic structures. For example, if the airfoil is designed to maintain laminar flow to about 30% or about 60% of the cord length, the surfaces 16 and 18 may be treated/coated utilizing the ablation and coating processes described herein.

With reference to FIG. 3, a substrate 26 may comprise aluminum or other material utilized to form an aerodynamic surface of an aircraft 1 or other vehicle or object. A laser may be utilized to ablate the substrate 26 to form a treated substrate surface 32 having a plurality of grooves 28 (e.g. 28A-28D) and ridges 30 (e.g. 30A-30E). The ridges 30 have a width "W1" and the grooves 28 have a width "W2." Width W2 may be approximately equal to the diameter of the laser utilized to ablate substrate 26 if each groove is formed by a single pass of the laser. Wider grooves may be formed if multiple laser passes are utilized. The grooves 28 have a depth that is substantially equal to a height "H" of the ridges 30. In general, the width W1 may be about 1.0 to about 500 micrometers, the width W2 may be about 5.0 to about 75 micrometers, and the height H may be about 0.1 micrometers to about 40 micrometers. The treated substrate surface 32 preferably has a roughness of about 1.0 micrometers to about 3.0 micrometers. However, the treated substrate surface 32 may have roughnesses in a broader range of about 1.0 micrometers to about 300 micrometers. It will be understood that FIG. 3 is a schematic view showing a small portion of the treated substrate surface 32, and the treated substrate surface 32 may include a very large number of grooves 28 and ridges 30. For example, the substrate surface 32 could span the entire length of an aircraft wing or wind turbine blade or other such structure. Alternatively, treated substrate surface 32 may cover a relatively small portion of a structure, such as the leading edge of a wing.

If the substrate 26 comprises an aluminum alloy, the laser may have an energy in the range of about 20 μJ to about 100 μJ. However, the laser energy may vary depending upon the type of material utilized to form substrate 26, and the surface roughness required for a particular application. The grooves 28 and ridges 30 may be configured to be aligned with a direction of the air flow as shown by the arrow "A1." Alternatively, the grooves 28 and ridges 30 may be oriented such that they are transverse to the direction of airflow as indicated by the arrow "A2." The grooves 28 and ridges could be oriented at any angle including and between the arrows A1 and A2. The grooves 28 and ridges 30 may have uniform sizes as shown in FIG. 3, or the grooves 28 and ridges 30 may have varying sizes and/or shapes. For example, the angle between the surfaces of sidewalls "S" and bases "B" (FIG. 3) may be virtually any angle between about 5 degrees (which would result in a very slow change in topography) to greater than about 90 degrees (e.g. up to 135 degrees) which would result in a re-entrant structure.

With further reference to FIG. 4, substrate 26A may be ablated utilizing a criss-cross laser pattern to produce a plurality of protrusions 34, each having a height H. The protrusions 34 may have a width W1, and the protrusions 34 may be spaced apart distances W2 and W3. The distances W2 and W3 may be equal, and the protrusions 34 may have square cross-sectional shapes as shown in FIG. 4. Alternatively, W2 may not be equal to W3, and the protrusions 34 may have a rectangular cross-sectional shape. Protrusions 34 may have four side surfaces S1-S4, and an end surface "E."

It will be understood that FIGS. 3 and 4 are schematic in nature, and the surface features produced by the laser ablation process may have shapes that are not precisely the same as the shapes shown in FIGS. 3 and 4. Also, the dimensions W1, W2, W3, and H may vary at least somewhat across the treated substrate surfaces 32 and 32A. Protrusions 34 may have substantially uniform cross-sectional shapes as shown in FIG. 4, or the protrusions 34 may have one or more side surfaces S1-S4 that are not orthogonal to base surface B. For example, the protrusions 34 could be pyramid-shaped, with a vertex rather than a flat end surface E.

With further reference to FIG. 5, the treated substrate surfaces 26 and 26A are coated with an epoxy resin 36 that is cured to provide a smooth aerodynamic outer surface 38. The epoxy resin 36 is applied in an uncured state, and the resin is then cured to form a solid layer 40. The epoxy resin may comprise a fluorinated alkyl ether epoxy resin as disclosed in U.S. Patent Publication No. 2015/0344748, the entire contents of which are incorporated herein by reference. The solid layer 40 may, alternatively, comprise other materials such as urethanes, acrylics, silicones, or the like. Preferably, the solid layer 40 has a modulus of elasticity that is significantly less than a modulus of elasticity of the substrate material 26, 26A. In particular, the modulus of elasticity of the solid layer 40 is preferably at least an order of magnitude less than the modulus of elasticity of the substrate material 26, 26A. Also, the solid layer 40 preferably has a thickness "T" that is greater than the height of the ridges 30 and/or protrusions 34. The portions of the solid layer 40 disposed between surface 42 of surface features 30 and 34 have a thickness "T1." The thickness T1 may be very small but is preferably greater than zero to ensure that aerodynamic surface 38 is smooth.

Because the solid layer 40 is relatively thin, and has a modulus of elasticity that is significantly less than the modulus of elasticity of the substrate material 26, the solid layer/coating 40 deforms when insects or other objects impact aerodynamic surface 38. Insect residue 44 and corresponding deformation 38A of surface 38 are shown schematically in FIG. 5. The interaction between two surfaces (e.g. insect residue 44 and aerodynamic surface 38) is governed by numerous variables, including material properties such as surface chemistry, surface topography, and surface mechanical properties. The combination of laser ablation and coating with an epoxy resin provides for controlled modification of the surface mechanical properties and provides a smooth aerodynamic surface 38 that permits laminar flow of air over the aerodynamic surface 38, while reducing buildup/adhesion of insect residue and/or other material on the smooth aerodynamic surface 38. Also, because the surface 38 is smooth, the surface 38 mitigates or reduces ice accretion (buildup).

Testing of insect impact on a aerodynamic surface 38 produced according to the present disclosure demonstrates that the aerial coverage due to insect impact on surface 38 is about the same or slightly greater than other known surfaces, which is still lower than an unmodified aerodynamically smooth surface. Furthermore, the height of the insect residue due to an insect impact on aerodynamic surface 38 is significantly reduced relative to other known surfaces. Accordingly, the reduced height of insect residue provides for laminar flow that reduces aerodynamic drag, without the problems associated with uncoated ablated surfaces.

It is to be understood that variations and modifications can be made on the aforementioned materials, structure, and processes without departing from the concepts of the present invention, and further it is to be understood that such concepts are intended to be covered by the following claims unless these claims by their language expressly state otherwise.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A method of forming a smooth aerodynamic surface, wherein the resulting smooth aerodynamic surface prevents disruption of laminar flow of air over the smooth aerodynamic surface, the method comprising:
   ablating selected portions of a surface of a substrate material utilizing a laser to form a treated substrate surface having a roughness of about 1.0 micrometer to about 3.0 micrometers to promote abhesion;
   coating the treated substrate surface with a coating material;
   curing the coating material to form a solid layer of the coating material on the treated substrate surface, the solid layer of the coating material having a smooth aerodynamic surface that promotes laminar flow of air over the smooth aerodynamic surface, and a thickness of about 1.0 micrometers to about 100 micrometers; and wherein:
   the solid layer of the coating material has a lower modulus of elasticity than the substrate material, and the roughness of the substrate, combine to provide a durotaxis effect when an insect impacts and deforms the solid layer of the coating material to thereby reduce adhesion of insect residue on the smooth aerodynamic surface of the coating material.

2. The method of claim 1, wherein:

the coating material comprises epoxy that forms a solid layer of epoxy when cured.

3. The method of claim 2, wherein:

the smooth aerodynamic surface of the solid layer of epoxy has a roughness of less than about 0.5 micrometers.

4. The method of claim 2, wherein:

the solid layer of epoxy has a thickness of about 1.0 to about 3.0 micrometers.

5. The method of claim 1, wherein:

the solid layer of the coating material has a modulus of elasticity that is at least about an order of magnitude less than a modulus of elasticity of the substrate material.

6. The method of claim 1, wherein:

the solid layer of the coating material has a modulus of elasticity in a range of about 4,000 psi to about 435,000 psi.

7. The method of claim 1, wherein:

the smooth aerodynamic surface has a roughness of less than about 20 micro-inches.

8. The method of claim 1, wherein:

the substrate material comprises an aluminum alloy.

9. The method of claim 1, wherein:

the substrate material comprises a composite material having reinforcing fibers embedded in a polymer matrix.

10. The method of claim 1, including:

utilizing the smooth aerodynamic surface to form at least a portion of an airfoil.

11. The method of claim 1, wherein:

the coating material has a viscosity of about 5 to about 100000 cp.

12. The method of claim 1, wherein:

the laser ablates the substrate surface in a manner that causes the treated substrate surface to include a plurality of parallel grooves that are spaced apart about 25 micrometers, wherein the parallel grooves are about 5 micrometers to about 75 micrometers wide, and have a depth of about 0.1 micrometers to about 40 micrometers.

13. The method of claim 12, including:

aligning the parallel grooves based on a direction of airflow over the smooth aerodynamic surface.

14. The method of claim 1, wherein:

the laser ablates the substrate surface in a manner that causes the treated substrate surface to have a plurality of grooves that crisscross.

15. The method of claim 1, wherein:

the coating material comprises fluorinated alkyl ether epoxy resin.

16. A method of forming a smooth aerodynamic surface that permits laminar flow of air over the smooth aerodynamic surface, the method comprising:

providing a material forming a substrate, the material having a first modulus of elasticity;

ablating selected portions of a surface of a substrate utilizing a laser to form a treated substrate surface having a predefined roughness of about 1.0 micrometer to about 3.0 micrometers to promote abhesion;

coating the treated substrate surface with an uncured coating material;

curing the coating material to form a solid layer of coating material on the treated substrate surface; and wherein:

the solid layer of coating material has a second Modulus of elasticity that is at least about an order of magnitude less than the first modulus of elasticity, and the roughness of the substrate, combine to provide durotaxis for deformation of the solid layer of coating material to reduce adhesion of insect residue on the solid layer of coating material due to the lower modulus of elasticity of the solid layer of coating material.

17. The .method of claim 16, wherein:

the solid layer of coating material comprises an epoxy material having a thickness of about 1.0 to about 100.0 micrometers.

18. A method of forming an aerodynamic surface that permits laminar flow of air over the aerodynamic surface, the method comprising:

ablating selected portions of a surface of a substrate material utilizing a laser to form a treated substrate surface having a predefined roughness selected to promote abhesion;

coating the treated substrate surface with a coating material having a modulus of elasticity that is at least about one order of magnitude less than a modulus of the substrate material;

curing the coating material to form a solid layer of the coating material having a smooth aerodynamic surface that permits laminar flow of air over the aerodynamic surface; and wherein:

the solid layer of the coating material reduces adhesion of inset residue due to durotaxis provided by the combination of the treated substrate surface having a predefined roughness and the greater elasticity of the coating material relative to the substrate material, the solid layer of coating material deforms in response to an impact of an insect, and the solid layer of the coating material has a thickness above the surface of the substrate material of about 1.0 micrometers.

19. The method of claim 18, wherein:

the predefined roughness is about 1.0 micrometers to about 300 micrometers.

* * * * *